United States Patent [19]

Balmer et al.

[11] Patent Number: 5,448,717
[45] Date of Patent: Sep. 5, 1995

[54] TRANSPARENTLY INSERTING WAIT STATES INTO MEMORY ACCESSES WHEN MICROPROCESSOR IN PERFORMING IN-CIRCUIT EMULATION

[75] Inventors: Mark J. Balmer, Tigard, Oreg.; Steven M. Farrer, Santa Clara, Calif.

[73] Assignee: Intel Corporation, Santa Clara, Calif.

[21] Appl. No.: 88,151

[22] Filed: Jul. 6, 1993

[51] Int. Cl.$^6$ .................................. G06F 1/04
[52] U.S. Cl. ........................... 395/550; 395/500; 364/16.2; 364/927.81; 364/934.61; 364/945.7; 364/961.3
[58] Field of Search .............. 395/500, 550, 775; 371/16.2, 16.5

[56] References Cited

U.S. PATENT DOCUMENTS

| | | | |
|---|---|---|---|
| 4,414,664 | 11/1983 | Greenwood | 371/20 |
| 4,631,702 | 12/1986 | Korba | 395/550 |
| 4,785,416 | 11/1988 | Stringer | 395/500 |
| 4,847,757 | 7/1989 | Smith | 395/325 |
| 5,025,364 | 6/1991 | Zellmer | 395/500 |
| 5,083,266 | 1/1992 | Watanabe | 395/275 |
| 5,151,986 | 9/1992 | Langan et al. | 395/550 |
| 5,159,679 | 10/1992 | Culley | 395/425 |
| 5,220,659 | 6/1993 | Larson et al. | 395/500 |
| 5,226,122 | 7/1993 | Thayer et al. | 395/275 |
| 5,247,636 | 9/1993 | Minnick et al. | 395/425 |
| 5,321,828 | 6/1994 | Phillips et al. | 395/500 |

Primary Examiner—Thomas C. Lee
Assistant Examiner—Lance Leonard Barry
Attorney, Agent, or Firm—Blakely, Sokoloff, Taylor & Zafman

[57] ABSTRACT

The invention provides a register, which when set to a specific value, ensures that memory accesses take at least a specified number of clock cycles. The invention specifically introduces delays into the memory accesses when a memory bank control register is configured to operate the memory bank in a fast-CAS (fast column address strobe) mode of operation. The delays are introduced transparent to the values in the memory bank control register that otherwise controls the operation of the memory bank. The delay introduced by the invention permits an in-circuit-emulation (ICE) system sufficient time to transfer trace data from the microprocessor to the ICE-base.

12 Claims, 3 Drawing Sheets

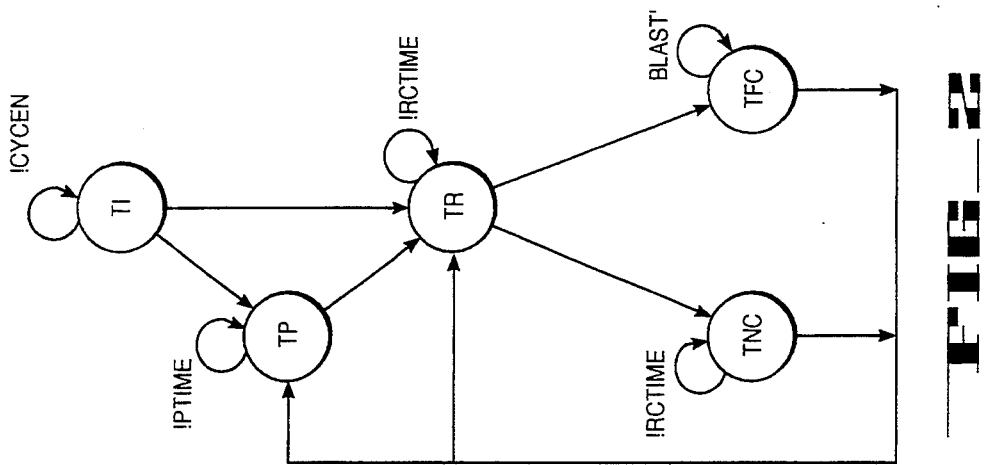
FIG_2
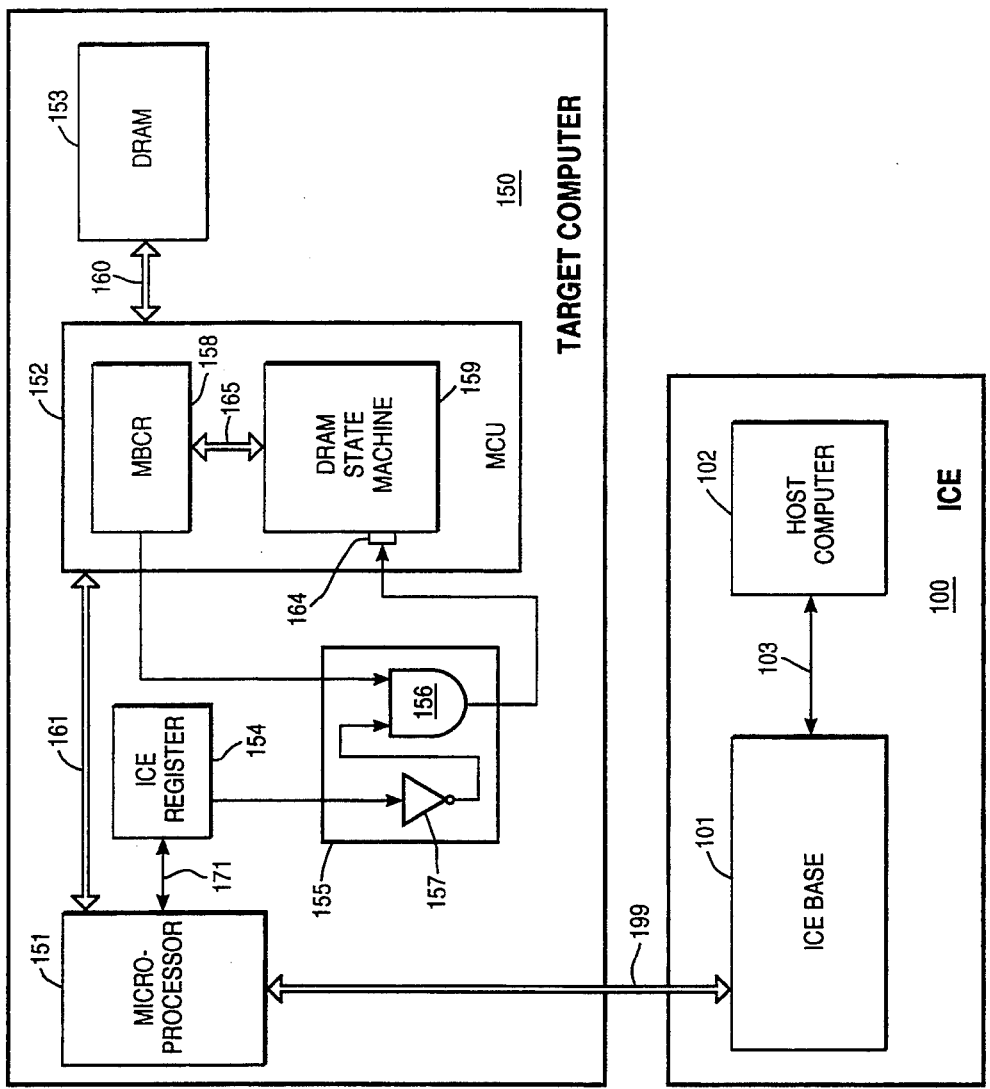
FIG_1

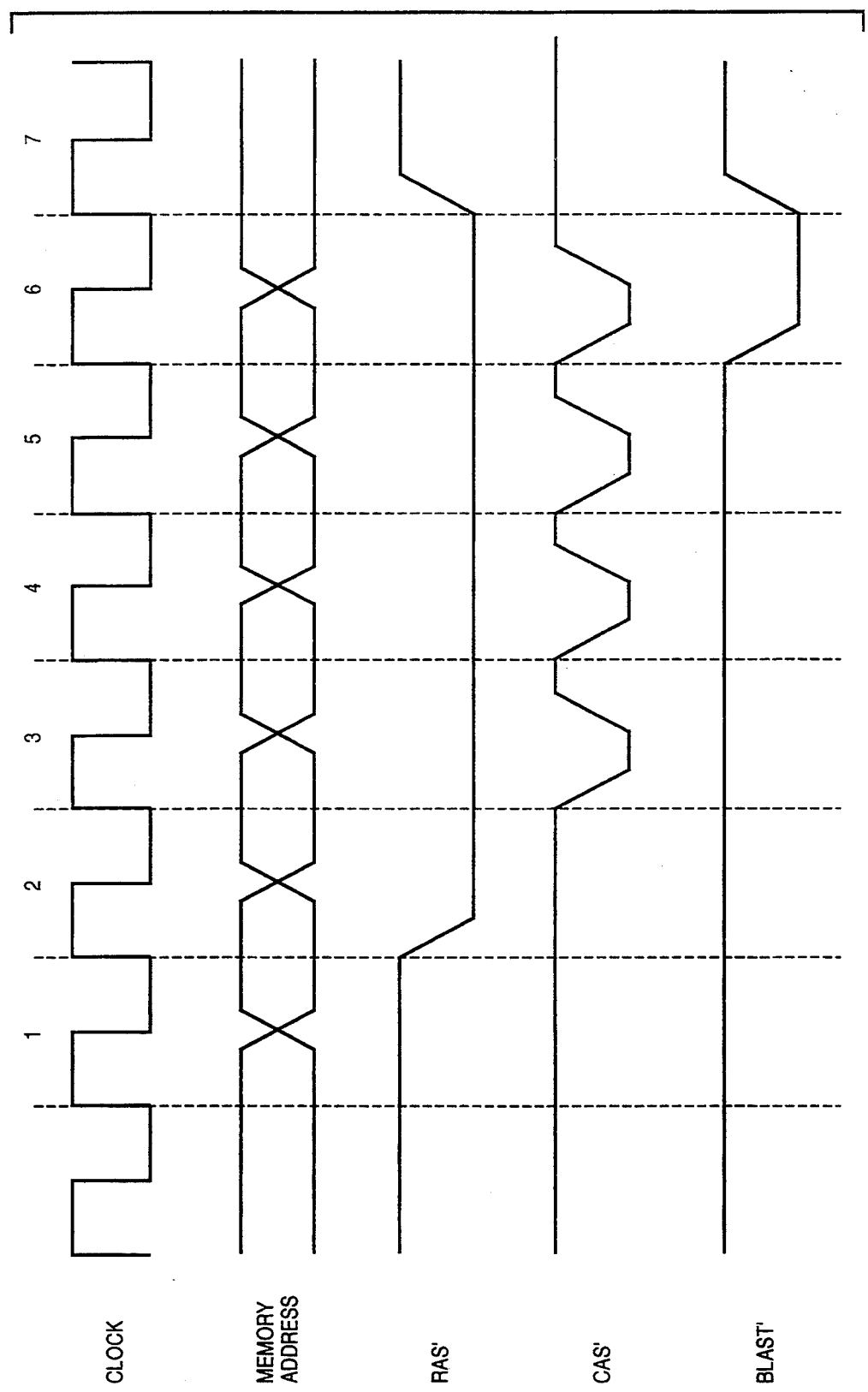
FIG_3

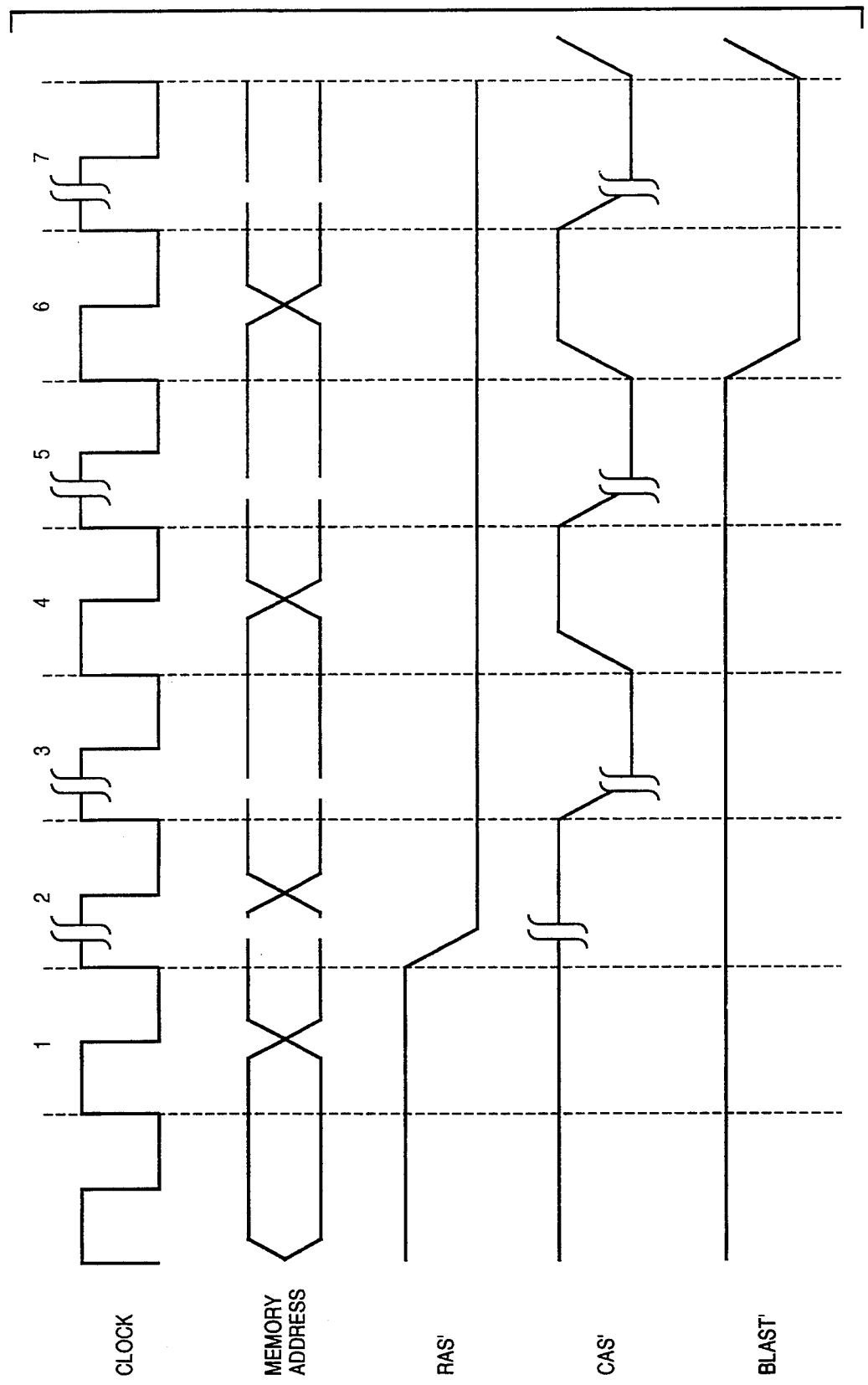
FIG_4

TRANSPARENTLY INSERTING WAIT STATES INTO MEMORY ACCESSES WHEN MICROPROCESSOR IN PERFORMING IN-CIRCUIT EMULATION

BACKGROUND OF THE INVENTION

1. Field of Invention

This invention pertains to the field of computer systems and more specifically to an apparatus for introducing wait states into a memory access.

2. History of the Prior Art

Computer systems including a microprocessor, a dynamic random access memory (DRAM), a memory control unit (MCU) and support for in-circuit-emulation (ICE) are well known in the prior art. A typical ICE-system in operation includes an ICE-base, a cable coupling the ICE-base to the target microprocessor in the computer system, and a host computer that provides the user interface. The cable comprises a number of channels and is used to transfer the trace-data from the target microprocessor and to send commands to the target microprocessor from the ICE-system. The host computer is connected to the ICE-base and provides the user-interface to view data and to be able to send commands.

The MCU is usually coupled to the microprocessor by a bus. The MCU interfaces with the microprocessor and interacts with the DRAM to service the read and write requests from the microprocessor. The DRAM typically includes several banks of memory. Each of the memory banks may support different speeds of operation. In such instances, a memory bank control register (MBCR) disposed in the MCU is used and is set to values that correspond to the speed of operation of the associated memory bank. The MCU also normally includes circuitry for accepting the values in the MBCRs to generate control signals to the memory banks to service read and write requests.

In some prior art computer systems multiplexed addressed buses have been used. Intel's 486SLC is an example of one such processor. In these systems, each half of the memory address is transferred in two successive clock cycles. Thus the memory accesses typically take at least two clock cycles. However, the processor supports a Fast Column Address Strobe (fast-CAS) mode of operation in which the access time is reduced to one clock cycle in the steady state. This is accomplished by using a special signal in the MCU which indicates if the row address of the present operation is the same as that of the previous access. In this case, only the column address is transmitted. Thus, the memory accesses are accomplished in one clock cycle in the steady-state.

When the computer system is operating in conjunction with the ICE-system, it may be operating either in ICE-mode or ICE-user-mode. In the ICE-mode, the processor in the computer system executes code sent by the ICE-system. In the ICE-user-mode, the user code resident in the computer memory is executed. In the ICE-user-mode, the address and data buses are traced and the data is transferred to the ICE-base.

When the memory bank is operating in the fast-CAS mode and the processor is operating in the ICE-user-mode, the ICE-system usually does not have sufficient time to transfer the trace data from the target processor to the ICE-base. This is because trace of data and address are interleaved on the same bus and a memory access trace operation takes two packets that need to be transferred in two clock cycles. Changing the values in the MBCR to slow down the memory access cannot be relied upon since the basic input/output system (BIOS) or other system software may overwrite the values changed. Increasing the number of channels in the ICE system may be cost-prohibitive or may require major engineering changes.

What is needed then is a way to increase the memory access time transparent to the values in the MBCR when the target processor is in the ICE-user-mode. Such a system should be able to provide the ICE-system with sufficient time to transfer data from the target computer system to the ICE-base without causing any degradation in performance when the target processor is not operating in the ICE-user-mode.

SUMMARY OF THE INVENTION

The present invention provides a means to introduce wait states into the memory accesses of a memory bank when a microprocessor is operating in an in-circuit emulation (ICE) user-mode allowing emulation of the microprocessor. The additional delay ensures that the ICE-system has sufficient time to transfer the trace data from the target processor to the ICE-base. However, the memory accesses are unaffected when the microprocessor is not operating in the ICE-user-mode.

To achieve this, the present invention includes a first means for indicating when the processor is operating in the ICE-user-mode. As will be seen, a specific value in the first means ensures that the memory bank is operated in such a way as to take at least a predetermined number of clock cycles. Delays are introduced into the memory accesses accordingly when required. The first means can be changed to reflect if the target processor is operating in the ICE-user-mode or not as the computer system goes in and out of the ICE-user-mode.

The invention further includes a memory bank control register MBCR configured for indicating if the memory bank is to operate in the fast-CAS mode. The MBCR contains other values that determine the speed of operation of the memory bank. A second means that couples to the first means and the MBCR is provided for generating a first signal when the processor is operating in the ICE-user-mode and the MBCR is configured to operate the memory in the fast-CAS mode. The second means further generates a second signal when the processor is not operating in the ICE-user-mode but when the MBCR is configured to indicate that the memory is to operate in the fast-CAS mode. In one embodiment, the second means generates the first signal when the MBCR is configured to operate the memory bank in a mode other than the fast-CAS mode.

The preferred embodiment also includes a memory controller means that is responsive to the second means for providing the control signals to operate the memory bank. The controller means operates the memory bank in the fast-CAS mode in response to the second signal. In the fast-CAS mode, the memory accesses are completed at a rate of one per every clock cycle in the steady state. In response to the first signal, the controller operates the memory bank in a mode other than the fast-CAS mode. In this case the memory accesses take at least two clock cycles.

Thus, when the value in the first means is changed to indicate that the processor is operating in the ICE-user-mode, the memory accesses are forced to happen in not less than two clock cycles even if the MBCR is configured to operate the memory bank in one clock cycle. On the other hand, when the first means indicates that the processor is not in the ICE-user-mode, the controller means drives the memory bank so as to have memory accesses occur in one clock cycle in the fast-CAS mode.

Thus, the present invention introduces wait-states into the memory access transparent to the values in the MBCR. The performance of the memory system is unaffected when the processor is not operating in the ICE-user-mode.

BRIEF DESCRIPTION OF THE DRAWINGS

FIG. 1 shows the components of the computer system that are necessary for understanding the present invention.

FIG. 2 shows the state diagram for the DRAM state machine that controls the operation of the DRAM.

FIG. 3 is a timing diagram of a memory access in fast-CAS mode of operation when the ICE-user-mode is not enabled.

FIG. 4 is a timing diagram of the memory access in fast-CAS mode of operation when ICE-user-mode is enabled.

DETAILED DESCRIPTION

An apparatus to allow privileged software to change the number of cycles that a programmable memory control unit takes to perform a memory access is disclosed. Numerous specific details are set forth in this description in order to provide a thorough understanding of the invention. It will be obvious, however, to one skilled in the art that these specific details need not be used to practice the present invention. In other instances, well-known circuits and system components have not been described in detail in order to avoid obscuring the present invention.

FIG. 1 shows a functional diagram of a computer system 150 working in conjunction with an in-circuit-emulation (ICE) system 100. The ICE system 100 is used to emulate a microprocessor 151 in the computer system 150. The computer system 150 further includes a dynamic random access memory (DRAM) 153, a memory control unit (MCU) 152, an ICE-register 154 and a fast-CAS selection circuitry 155. A specific bit in the ICE-register 154 is set to a value of 1 by the emulator when the microprocessor is operating in the ICE-user-mode; else it is set to 0. A bus 161 couples the microprocessor 151 to the MCU 152 and includes address bus, data bus and other control signals. The microprocessor 151 makes memory access requests to the MCU 152 using this bus 161. The MCU 152 responds to the microprocessor 151 using the same bus 161. A bus 160 couples the DRAM 153 to the MCU 152. The MCU 152 uses the bus 160 to access the memory banks and control the operation of the DRAM 153.

The ICE-system 100 comprises an ICE-base 101, a host computer 102 and asynchronous connection 103. The ICE-base 101 is coupled to the computer system 150 by means of a cable 199. Cable 199 comprises multiple channels which are used to transfer trace-data from the computer system 150 to the ICE-base 101 and to send commands from the ICE-base back to the computer system 150. The host computer 102 provides the user interface to the ICE system 100 and permits the user of the ICE system 100 to view the trace-data and input commands.

The MCU 152 accepts requests from the microprocessor 151 for memory accesses. MCU 152, in turn, provides the control signals to the DRAM 153 to access memory. Typically, DRAM 153 comprises multiple memory banks supporting more than one mode of operation. The MCU 152 uses inputs from the fast-CAS determination circuitry 155 to differentiate between the various modes of operation of the memory banks.

When the computer system 150 is operating in conjunction with the ICE system 100, the cable 199 is used to transfer the trace data from the computer system 150 to the ICE-base 101. The trace-data includes address, data and other control signals. Two clock cycles are needed to transfer the trace-data from the computer system 150 to the ICE-base 101.

Continuing with reference to FIG. 1, the MCU 152 further comprises a memory bank configuration register MBCR 158 and a DRAM state machine 159. The DRAM state machine 159 accepts as inputs the values in MBCR 158, the output of the fast-CAS determination circuitry 155 and control signal lines BLAST and CYCEN from microprocessor 151 on bus 161. The microprocessor 151 uses the BLAST signal to indicate to the MCU 152 the end of current burst in the fast-CAS mode of operation. The CYCEN signal line signals the beginning of an active access cycle when the memory is idle.

The values in the MBCR 158 define the mode and parameters for various wait-states in the operation of the memory bank in DRAM 153. In one embodiment, a value of 1 in the tenth bit indicates if the memory is to operate in the fast-CAS mode. Bit positions 8-10 define the CAS access time. This is the amount of time the CAS' line needs to be asserted for a valid access. A value of 100 in the bit locations 8-10 means a CAS access time of 0.5 clock cycles. This corresponds to the fast-CAS mode of operation. Values of 000, 001, 010 and 011 in these bit locations represent CAS access times of 1,2, 3 and 4 clock cycles, respectively.

Similarly bits 12 and 13 determine the RAS-to-CAS access time RCTIME, which is the time from RAS active before CAS is allowed to go active. In the current embodiment, values 00, 01, 02 and 03 in bit positions 12-13 correspond to RAS-to-CAS access times of 1,2, 3, and 4 clock cycles respectively. The bit locations 14 and 15 determine the RAS pre-charge time. Values of 00, 01, 10 and 11 in these bits correspond to 1, 2, 3 and 4 clock cycles respectively. Bits 14 and 15 of the MBCR 158 determine the RAS pre-charge time PTIME, which is the required number of cycles for DRAM 153 to remain high before accessing with an active low. Values of 00, 01, 10 and 11 correspond to 1, 2, 3 and 4 clock cycles respectively.

The MBCR 158 is coupled to the DRAM state machine 159 using a bus 165. This bus includes lines to enable the state machine to use the values in the MBCR 158. These values are used to determine the state flow and different wait-states. The state machine uses value on the fast-CAS input 164 to determine if the memory is to operate in the fast-CAS mode or not at a given time. Based on these inputs, the state machine sends the control signals to the DRAM 153.

FIG. 2 shows the DRAM state flow diagram for the DRAM state machine 159. The state TI in FIG. 2 represents the 'idle state' of the DRAM. The DRAM is in this state when there are no cycles pending as indicated by the cycle enable signal CYCEN. When the CYCEN signal goes high, the state machine goes to RAS pre-charge state TP or RAS active state TR depending on if the ROW access lines are pre-charged. If the row access lines are not pre-charged, the state machine goes to the RAS pre-charge state TP. The state machine remains in this state for pre-charge time PTIME to allow the RAS to pre-charge. PTIME is determined by the value in the memory bank control register MBCR as described above. The state machine then goes to the RAS Active state TR. The state machine remains in this state for RAS-TO-CAS delay time RCTIME. RCTIME is also determined by the values in the MBCR.

From the RAS active state TR, the state machine goes to either normal CAS state TNC or the Fast CAS active state TFC depending on the value of the fast-CAS input 165. A value of 1 on this line indicates that the memory is to operate in the fast-CAS mode. A value of 0 indicates that the memory is to operate in the non-fast-CAS mode.

If the memory bank is to operate in the fast-CAS mode, the machine goes to fast-CAS state TFC. The machine continues to cycle through this state as long as the burst-status line BLAST is asserted to 1. In each of the cycles, one access is complete. The microprocessor 151 asserts BLAST line on bus 61 to 0 to indicate that the current burst transaction is the last and that the burst transfer is complete.

From TFC the state machine goes to idle state TI if there are no cycles pending. If there are cycles pending and if the access is to a different row, the machine goes to the RAS pre-charge state TP. The machine stays in this state for pre-charge time PTIME and goes to the TR state. If the access is to the same row when in the TFC state, the machine goes to the TR state.

On the other hand, if the DRAM state machine 159 is not in the fast-CAS mode, it goes to the Normal CAS Active State TNC from TR. In TNC it waits for RAS-to-CAS time RCTIME. This value is determined by the value in the memory bank control register MBCR 158 as described above. From TFC state, the DRAM state machine 159 goes to TR state if the next access is to the same row else it goes to the TP state for the RAS to pre-charge. If no more cycles are pending, it goes to the idle state TI.

Referring again to FIG. 1, here is shown an ICE register 154. ICE register 154 is used to indicate when the processor is operating in the ICE-user-mode. When the computer system 150 is working in conjunction with the ICE-system 100, the processor 151 can be operating in either the ICE-mode or the ICE-user-mode. In the ICE-mode, the processor 151 is executing code provided by the ICE-system 100. In the ICE-user mode, the code resident in the computer memory is executed. It is in the ICE-user mode that the trace of the address, data and other control lines is captured and transferred to the ICE-base 101. When the ICE-system enters the ICE-user mode, the system software sets an ICE-bit in the ICE register 154 to a 1. When the ICE-user mode is exited, the system software resets this bit to a 0 again. A line 171 couples the microprocessor 151 to the ICE register 154 and is used by the microprocessor 151 for changing the values in the ICE-bit.

The ICE-bit is coupled to fast-CAS selection FCS apparatus 155. The FCS apparatus 155 comprises an inverter 157 and an AND gate 156. The ICE-bit in the ICE register 154 is coupled to the input of the inverter 157. The output of the inverter 157 is coupled to the input of the AND gate 156. The other input of the AND gate 156 is coupled to the tenth bit of the memory bank control register MBCR 158. As explained, this bit has a value of 1 when the memory is to be operated in the fast-CAS mode. The output of the AND gate 156 is coupled to the fast-CAS input 164 of the DRAM state machine 159.

Thus when the processor 151 is not in the ICE mode, the ICE bit is set to 0. When this is zero, the output of the inverter 157 is set to 1. Since this couples to the input of the AND gate 156, the output of the AND gate 156 will be the value on the other input of the AND gate 156. This means that the 10th bit in the MBCR 158 will be available at the line 163 of the DRAM state machine 159.

In the fast-CAS mode of operation, the 10th bit in the memory bank register is 1. Thus this value is available on the fast-CAS input 164 of the state machine 159. Referring back to FIG. 4, when the state machine 159 gets out of the RAS active state TR, it goes to the fast-CAS state TFC. It cycles through this state until the BLAST signal is asserted to 0.

The corresponding timing diagram is shown in FIG. 3. In clock cycle 1, the row address is available on the bus. The RAS pre-charges for one clock cycle as defined in the MBCR 158. Now the DRAM state machine 159 moves to RAS active state TR. The RAS' is asserted low so as to latch the address bits into the row decode buffer of the DRAM 153. It waits for RCTIME as specified by the MBCR 158. This corresponds to clock cycle 2 in the FIG. 3. Since the fast-CAS input 164 has a value of 1, the state machine 159 now moves to the CAS active state TFC. It cycles through TFC every clock cycle until the BLAST signal is asserted to 0. In the diagram, the BLAST signal remains high in clock cycles 3, 4 and 5. During these cycles, the column address is multiplexed on the address bus each clock cycle and the CAS is asserted low each clock cycle to latch the data into the column address buffers of the memory system. The RAS continues to be asserted low during each of these cycles. The data is accessed a clock cycle after the column address is transmitted. In the steady state, we have one access each clock cycle. Thus during the fast-CAS mode of operation when the ICE mode is not available, the present invention supports a data access each clock cycle.

The timing diagram of the memory operation when the ICE-user-mode is enabled and when the memory is operating in the fast-CAS mode is shown in FIG. 4. The 10th bit of the MBCR 158 will be a 1 corresponding to the fast-CAS mode of operation. When the processor 151 enters the ICE-user-mode, the ICE-bit in the ICE-register is set to 1. When this is 1, the output of the inverter 157 is set to 0. Since this is coupled to the input of the AND gate 156, the output of the AND gate 156 is set to 0 irrespective of the other input coupled to the 10th bit of the memory bank control register 158. Thus a value of 1 in the ICE-bit forces the output of the AND gate 156 to be a 0.

Since the output of the AND gate 156 is coupled to the fast-CAS input 164 of the DRAM state machine 159, a value of 0 is available at the fast-CAS input 164. When the state machine 159 moves out of the RAS active state TR in FIG. 2, this forces the DRAM state machine 159 into the CAS active state TNC. It stays in the TNC state for RCTIME and then moves to the RAS active state TR if the next access is to the same row. The DRAM state machine 159 circles through TNC and TR states as long as access is to this same row in this burst.

The corresponding timing diagram is shown in FIG. 4. In clock cycle 1, the row address is transmitted on the address bus. The state machine 159 waits for PTIME amount of time in this state. In clock cycle 2, the RAS' goes low to latch the address bits on to the row address buffer of the memory system. The state machine 159 waits for RCTIME here. The broken clock cycle corresponds to the cases where RCTIME is more than one clock cycle. After this is completed, the column address is transmitted on the bus. In clock cycle 3 in the figure, the CAS' is asserted low to load the column address into the column buffer of the memory system. The state machine waits here for RCTIME. The data accessed as a result is available towards the end of cycle 3. The RAS' continues to be asserted low if the memory bank control register is configured for fast-CAS mode of operation. In the second phase of clock cycle 4 in the figure, the address corresponding to the next column is transmitted on the address bus. At the beginning of clock cycle 5, the CAS' is asserted low. The data corresponding to this column is available in clock cycle 6. In the steady state the data accesses take at least two clock cycles.

Thus the rate of data accesses is decreased by introducing wait states into the operation of the memory system. Further, the fast-CAS mode can be restored by setting the ICE-bit to 0. This restores the rate of accesses to one per clock cycle in the steady state of the fast-CAS mode. In the system development process, the processor 151 potentially enters and leaves ICE-user-mode several times. When the processor 151 enters the ICE-user-mode, the ICE bit is set by privileged instructions. When the ICE-bit is set, the wait states are introduced transparent to the values in the other registers if the memory is operating in the fast-CAS mode. Once the processor 151 leaves the ICE-user-mode, the ICE-bit is reset to 0. If the memory is configured for fast-CAS mode, this is automatically restored.

Thus the ICE-bit is set to a 1 when the computer system 150 enters the ICE-user-mode and the memory accesses take at least two clock cycle even when the memory bank is operating in the fast-CAS mode. This ensures that the ICE-system 100 has sufficient time to transfer the trace-data from the target processor to the ICE-base 101.

Though this invention discloses introduction of wait-states into the operation of the memory system, the idea is generally applicable to any other component of a computer system. The same concept can be applied to increase the speed of the component also. Thus, the present invention discloses a method of introducing wait-states transparent to the other configuration registers into the operation of a computer system. This imposes a hardware enforced hierarchy of wait-states that can be set by entities with various privilege levels.

What is claimed is:

1. In a system comprising a target computer and an in circuit emulator (ICE), said system operable in a first ICE mode in which the target computer executes code provided by the ICE and returns status data regarding execution to the ICE, and a second ICE mode in which the target computer executes code resident in the target computer and returns status data regarding execution to the ICE, and said target computer performing memory accesses to at least one memory bank in a first access mode which requires a first number of clock cycles and a second access mode which requires a second number of clock cycles, said second number of clock cycles less than the first number of clock cycles, said ICE requiring a number of clock cycles greater than the first number of clock cycles to receive the status data, an apparatus which causes memory accesses to be performed in the second access mode when the system is in the second ICE mode comprising:

an ICE register located in the target computer to indicate the ICE mode;
a memory bank control register located in the target computer to indicate the access mode;
a logical device coupled to receive the output of the ICE register and the memory bank control register, said logical device generating a first or second control signal to indicate the access mode the target computer is to be performed, such that if the ICE register indicates the first ICE mode and the memory bank control register indicates the first access mode, the logical device generates the first control signal to indicate that the memory access is to be performed according to the first access mode, if the ICE register indicates the first ICE mode and the memory bank control register indicates the second access mode is to be performed, the logical device generates the second control signal to indicate that the memory access is to be performed according to the second access mode, and if the ICE register indicates the second ICE mode and the memory bank control register indicates the first access mode or the second access mode, the logical device generates the first control signal to indicate that the memory access is to be performed according to the first access mode.

2. The system as set forth in claim 1, wherein said target computer comprises multiple banks of memory and said memory bank control register comprising a plurality of mode bits indicating the access mode to be performed to access each memory bank of the multiple banks of memory, such that different memory banks can be access using different access modes.

3. The system as set forth in claim 1, wherein said target computer further comprises a processor and a memory control unit, said memory bank control register located within the memory control unit, said memory control unit performing accesses to the at least one memory bank, said processor writing to the ICE register to indicate the ICE mode.

4. The system as set forth in claim 1, wherein the first number of clock cycles is two clock cycles and the second number of clock cycles is one clock cycle.

5. A target computer system comprising a processor and memory, said memory accessed in a first access mode which requires a first number of clock cycles and a second mode which requires a second number of clock cycles, said second number less than the first number of clock cycles, an apparatus for performing in circuit emulation (ICE) of the target computer system comprising:

an ICE register to indicate a first ICE mode in which the target computer executes code provided by an external device and reports status data regarding execution to the external device, or a second ICE mode in which the target computer executes code resident in the target computer and reports status data regarding execution to the external device;

a memory bank control register located in the target computer to indicate the first access mode or the second access mode; and a logical device coupled to receive the output of the ICE register and the memory bank control register, said logical device generating a first or second control signal to indicate the access mode the target computer is to perform, such that if the ICE register indicates the first ICE mode and the memory bank control register indicates the first access mode, the logical device generates the first control signal to indicate that the memory access is to be performed according to the first access mode, if the ICE register indicates the first ICE mode and the memory bank control register indicates the second access mode is to be performed, the logical device generates the second control signal to indicate that the memory access is to be performed according to the second access mode, and if the ICE register indicates the second ICE mode and the memory bank control register indicates the first access mode or the second access mode, the logical device generates the first control signal to indicate that the memory access is to be performed according to the first access mode;

such that status can be reported in the first number of clock cycles.

6. The target computer system as set forth in claim 5, wherein said memory comprises multiple banks of memory and said memory bank control register comprising a plurality of mode bits indicating the access mode to be performed to access each memory bank of the multiple banks of memory, such that different memory banks can be access using different access modes.

7. The system as set forth in claim 5, wherein said target computer further comprises a memory control unit, said memory bank control register located within the memory control unit, said memory control unit performing accesses to the memory banks, said processor writing to the ICE register to indicate the ICE mode.

8. The system as set forth in claim 7, wherein said memory control unit further comprises a controller for receiving the control signal from the logic device to perform a memory access according the first or second access mode.

9. The system as set forth in claim 5, wherein the first number of clock cycles is two clock cycles and the second number of clock cycles is one clock cycle.

10. A target computer system comprising a processor and memory, said memory accessed in a first access mode which requires a first number of clock cycles and a second access mode which requires a second number of clock cycles, said second number less than the first number of clock cycles, an apparatus for performing in circuit emulation (ICE) of the target computer system comprising:

ICE mode means to indicate the ICE mode to be performed by the target computer system, wherein in a first ICE mode, the target computer executes code provided by an external means and reports status data regarding execution to the external means, and in a second ICE mode, the target computer executes code resident in the target computer and reports status data regarding execution to the external means;

memory means to indicate the access mode; and access mode means coupled to receive the output of the ICE mode means and the memory means, said access mode means indicating the access mode the target computer is to perform, such that if the ICE mode means indicates the first ICE mode and the memory means indicates the first access mode, the access mode means indicates that the memory access is to be performed according to the first access mode, and if the ICE mode means indicates the first ICE mode and the memory means indicates the second access mode is to be performed, the access mode means indicates that the memory access is to be performed according to the second access mode, and if the ICE mode means indicates the second ICE mode and the memory means indicates the first access mode or the second access mode, the access mode means indicates that the memory access is to be performed according to the first access mode;

such that status is reported in the first number of clock cycles.

11. The system as set forth in claim 10, wherein the first number of clock cycles is two clock cycles and the second number of clock cycles is one clock cycle.

12. In a system comprising a target computer and a bus, said system operable in a first operation mode in which the target computer executes code provided across the bus and returns information regarding execution to the bus, and a second operation mode in which the target computer executes code resident in the target computer and returns information regarding execution to the bus, and said target computer performing memory accesses in a first access mode which requires a first number of clock cycles and a second mode which requires a second number of clock cycles, said second number of clock access cycles less than the first number of clock cycles, said bus requiring a number of clock cycles greater than the first number of clock cycles to transmit the information, an apparatus which causes memory accesses to be performed in the second access mode when the system is in the second operation mode comprising:

an first register located in the target computer to indicate the operation mode;

a second register located in the target computer to indicate the access mode;

a logical device coupled to receive the output of the first register and the second register, said logical device generating a first or second control signal to indicate the access mode the target computer is to performed, such that if the first register indicates the first operation mode and the second register indicates the first access mode, the logical device generates the first control signal to indicate that the memory access is to be performed according to the first access mode, if the first register indicates the first operation mode and the second register indicates the second access mode is to be performed, the logical device generates the second control signal to indicate that the memory access is to be performed according to the second access mode, and if the first register indicates the second operation mode and the second register indicates the first access mode or the second access mode, the logical device generates the first control signal to indicate that the memory access is to be performed according to the first access mode.

* * * * *

UNITED STATES PATENT AND TRADEMARK OFFICE
CERTIFICATE OF CORRECTION

PATENT NO.   : 5,448,717
DATED        : September 5, 1995
INVENTOR(S)  : Balmer et al.

It is certified that error appears in the above-identified patent and that said Letters Patent is hereby corrected as shown below:

On the title page, Item [54]
    delete "IN" and substitute --IS--.

In column 1, in the title at line 3, delete "IN" and substitute --IS--.

Signed and Sealed this

Tenth Day of December, 1996

Attest:

BRUCE LEHMAN

Attesting Officer

Commissioner of Patents and Trademarks